(12) United States Patent
Lee

(10) Patent No.: US 7,633,162 B2
(45) Date of Patent: Dec. 15, 2009

(54) ELECTRONIC CIRCUIT WITH EMBEDDED MEMORY

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 473 days.

(21) Appl. No.: 11/092,521

(22) Filed: Mar. 29, 2005

(65) Prior Publication Data

US 2005/0218521 A1  Oct. 6, 2005

Related U.S. Application Data

(63) Continuation-in-part of application No. 10/873,969, filed on Jun. 21, 2004, now Pat. No. 7,052,941.

(51) Int. Cl.
*H01L 23/48* (2006.01)
*H01L 23/52* (2006.01)
*H01L 29/40* (2006.01)

(52) U.S. Cl. .................................... 257/758

(58) Field of Classification Search ............ 257/68–71, 257/296–309, 905–908, 621–774, 210–211, 257/503, 508, E33.062–E33.066, 295, E43.001–E43.007, 257/E27.074–E27.079, E27.08, E29.312–E29.313
See application file for complete search history.

(56) References Cited

U.S. PATENT DOCUMENTS

| | | | | |
|---|---|---|---|---|
| 6,150,214 A | * | 11/2000 | Kaeriyama | 438/253 |
| 6,229,161 B1 | * | 5/2001 | Nemati et al. | 257/133 |
| 6,790,713 B1 | * | 9/2004 | Horch | 438/135 |
| 2002/0024140 A1 | * | 2/2002 | Nakajima et al. | 257/758 |
| 2002/0125524 A1 | * | 9/2002 | Okudaira et al. | 257/310 |
| 2002/0153548 A1 | * | 10/2002 | Mizutani et al. | 257/296 |
| 2004/0023065 A1 | * | 2/2004 | Daughton et al. | 428/693 |
| 2004/0147077 A1 | * | 7/2004 | Watanabe et al. | 438/257 |
| 2004/0156233 A1 | * | 8/2004 | Bhattacharyya | 365/176 |

* cited by examiner

*Primary Examiner*—Dao H Nguyen
*Assistant Examiner*—Tram H Nguyen
(74) *Attorney, Agent, or Firm*—Schmeiser Olsen & Watts LLP

(57) ABSTRACT

Circuitry includes first and second circuits spaced apart by an interconnect region. The interconnect region includes a first interconnect and the second circuit includes a stack of semiconductor layers. The first interconnect extends between the first and second circuits to provide communication therebetween. The second circuit operates as a memory circuit.

55 Claims, 9 Drawing Sheets

ELECTRONIC CIRCUIT WITH EMBEDDED MEMORY

CROSS REFERENCE TO RELATED APPLICATIONS

This is a continuation-in-part of application Ser. No. 10/873,969, entitled "THREE-DIMENSIONAL INTEGRATED CIRCUIT STRUCTURE AND METHOD OF MAKING SAME", which was filed 21 Jun. 2004 now U.S. Pat. No. 7,042,941, and is incorporated in its entirety herein by reference.

BACKGROUND OF THE INVENTION

1. Field of the Invention

The present invention relates generally to semiconductor circuitry and, more particularly, to circuitry which includes memory devices.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices that are carried on a single major surface of a substrate. Active devices typically include transistors and passive devices typically include resistors, capacitors, and inductors. However, these laterally oriented devices consume significant amounts of chip area.

For example, a typical computer system includes a main computer chip with a processor circuit, a control circuit, and a memory cache that are carried on a single major surface of a substrate. The typical computer system also includes main memory which is positioned on a separate memory chip outside the main computer chip. Since the memory cache is positioned on the same substrate as the processor and control circuits in the main computer chip, it is often referred to as embedded memory.

The memory cache typically includes fast and expensive memory cells, such as Static Random Access Memory (SRAM) cells, and the main memory typically includes slower and less expensive Dynamic Random Access Memory (DRAM) cells. Both SRAM and DRAM cells are larger than the devices included in the processor and control circuits, with SRAM cells being much larger than DRAM cells. As is well-known in the art, cache memory (L1 cache or L2 cache, for example) is used to store information from a slower storage medium or subsystem, such as the main memory or peripherals like hard disks and CD-ROMS, that is accessed frequently to increase the operation of the main computer chip.

One reason the operation of the main computer chip is increased because its idle time is reduced. For example, when the processor circuit accesses the main memory, it does so in about 60 nanoseconds (ns). However, a typical processor circuit can have cycle times of about 2 nanoseconds. Hence, there are about 30 wasted cycles while the processor circuit accesses the main memory. As a result, the processor circuit is idle for many cycle times while it accesses the main memory.

The processor circuit, however, can access the cache memory in about 10 ns to 30 ns, so the idle time is significantly reduced if the information needed is stored in the cache memory. The access time of the processor circuit to a hard disk is even slower at about 10 milliseconds (ms) to 12 ms, and the access time to a CD-ROM drive is about 10 times greater than this. Hence, cache memory uses a small amount of fast and expensive memory to allow the processor circuit faster access to information normally stored by a large amount of slower, less-expensive memory.

With this in mind, it seems like the operation of the computer system can be speeded up even more by increasing the size of the cache memory so that it operates as the main memory or by embedding the main memory on the same substrate as the processor and control circuit and eliminating the cache memory altogether. However, there are several problems with doing this.

One problem with doing this is cost. As mentioned above, the SRAM cells included in cache memory are larger and expensive, so increasing the size of the cache memory would significantly increase the cost of the computer chip. DRAM cells are less expensive and smaller, but to embed them with the main computer chip will still significantly increase the cost. One reason the cost increases for both embedded SRAM and DRAM cells is because the number of masks needed to fabricate the main computer chip increases. For example, to embed SRAM and DRAM memory cells with the main computer chip would require about 3-4 and 6-8 extra masks, respectively. This is because the masks used to fabricate the processor and control circuitry are not compatible with the masks used to fabricate SRAM and DRAM memory cells. Another reason the cost increases is because, as discussed below, the yield in manufacturing computer chips decreases as the size of the computer chip increases.

Another problem is that in today's computer systems, the size of the main memory is much larger than the size of the cache memory. For example, in current state of the art systems, the main memory can store 256 MB to 1 GB in a single memory chip, but the cache memory can only store about 1 MB to 2 MB. This is because the size of the memory circuitry needed to store information in SRAM is much larger than that needed for DRAM. A conventional SRAM circuit includes six transistors to store one bit of information and a conventional DRAM circuit includes one transistor and one capacitor, which tend to be large, to store one bit of information.

For example, the size of a conventional embedded SRAM cell is about 70-120 $F^2$ and the size of a conventional DRAM memory cell is about 15 $F^2$. As is known in the art, 1 F is the minimum photolithographic feature size. Hence, if the computer chip is being fabricated using 90 nm lithography, then 1 F corresponds to 90 nm and 1 $F^2$ corresponds to an area that it 90 nm by 90 nm in size. If the computer chip is being fabricated using 60 nm lithography, then 1 F corresponds to 60 nm and 1 $F^2$ corresponds to an area that it 60 nm by 60 nm in size. Thus, to increase the size of the cache memory by increasing the number of SRAM cells included therein would significantly increase the size of the computer chip and decrease its yield. Further, most of the area on the computer chip will be occupied by memory circuitry instead of processor and control circuitry.

This presents several problems. As mentioned above, one problem is that the yield of computer chips in a manufacturing run decreases as their size increases. As is well-known in the art, several computer chips are fabricated from a single large wafer in a run. The individual computer chips carried by the wafer are typically referred to as die. Once the computer chips are fabricated, the die in the wafer are diced to provide separate chips. A wafer, however, has defects distributed throughout it surface which can negatively impact the operation of the computer chips. If the computer chip is larger in size, then it is more likely to include a defect from the wafer and if the computer chip is smaller in size, then it is less likely to include a defect from the wafer. Hence, smaller computer chips are less likely to be defective. Further, if the computer chip is smaller in size, then more of them can be fabricated from a single wafer, which also decreases costs. Hence, smaller computer chips increase the yield and decrease the costs.

Another problem is that it is typically desirable to increase the number of devices included in the processor and control circuitry so that the processor can operate faster and perform more complicated operations. It is desirable for computer chips to be fast so they can process more data in a given amount of time. The speed of operation of a computer chip is typically measured in the number of instructions per second it can perform.

Computer chips can be made to process more data in a given amount of time in several ways. In one way, the computer chip can include devices which are smaller, but this requires advances in lithography and increasingly expensive manufacturing equipment. As discussed above, they can also be made faster by decreasing the time it takes to perform certain tasks, such as storing or retrieving information to and from memory or other peripherals and subsystems.

Computer chips can also be made faster by increasing the number of devices included therein so that more information can be processed in a given period of time. For example, if one processor operates on 32-bit data, then another processor that operates on 64-bit data can process information twice as fast because it can perform more instructions per second. However, the 64-bit processor will need more devices since there are more bits to process at a given time. Hence, if most of the area on the computer chip is occupied by memory cells, then there is less area for the processor and control circuitry to process data with a higher number of bits. The total area of the computer chip can be increased, but as discussed above, this decreases the yield and increases the cost.

Accordingly, it is highly desirable to provide new structures and methods for fabricating computer chips which operate faster and cost effective to fabricate.

BRIEF SUMMARY OF THE INVENTION

The present invention provides circuitry which includes first and second circuits and an interconnect region. A first interconnect is included in the interconnect region. The first interconnect extends above and between the first and second circuits to provide communication therebetween. A third circuit is positioned on the interconnect region and a second interconnect is included in the interconnect region. The second interconnect extends between the third circuit and at least one of the first and second circuits to provide communication therebetween.

The present invention also provides circuitry which includes control and digital circuitry positioned on a substrate. An interconnect region is positioned on surfaces of the control and digital circuitry to provide communication therebetween. Memory circuitry is positioned on the interconnect region so that the interconnect region provides communication between the memory circuitry and the control circuitry.

The present invention further provides circuitry which includes a substrate and first and second processor circuits carried by the substrate. A control circuit is carried by the substrate and positioned near the first and second processor circuits. An interconnect region is carried by and extends from the substrate. The interconnect region allows the first and second processor circuits to communicate with each other and the control circuit. A memory circuit is positioned on the interconnect region so that the memory circuit is electrically coupled to the control circuit through the interconnect region.

These and other features, aspects, and advantages of the present invention will become better understood with reference to the following drawings, description, and claims.

DETAILED DESCRIPTION OF THE INVENTION

Figure 1:
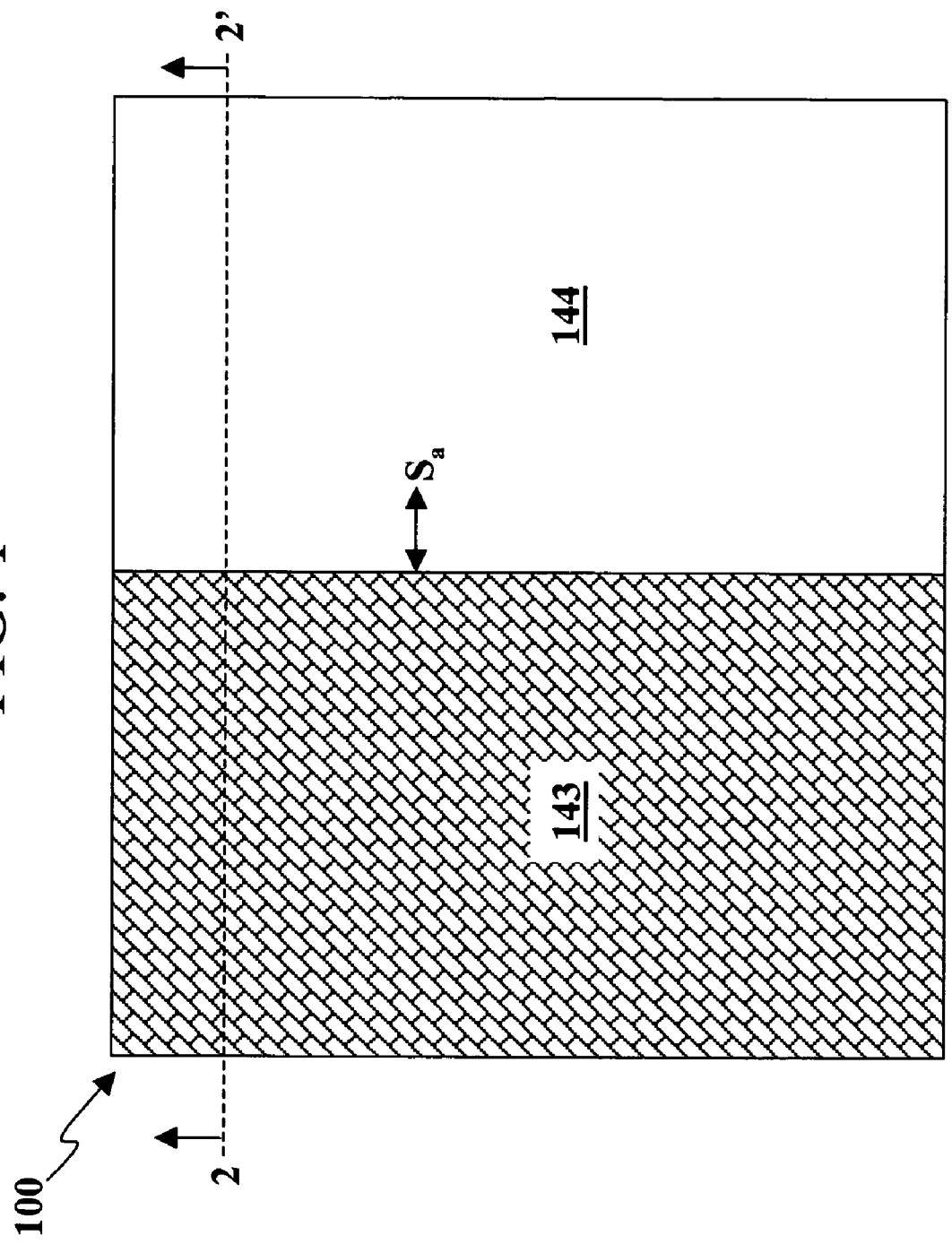
FIG. 1 is a simplified top view of a computer chip, in accordance with the present invention, with one processor positioned near a control circuit, the sectional view being taken along a cut line 1-1' of FIG. 2.
Figure 2:
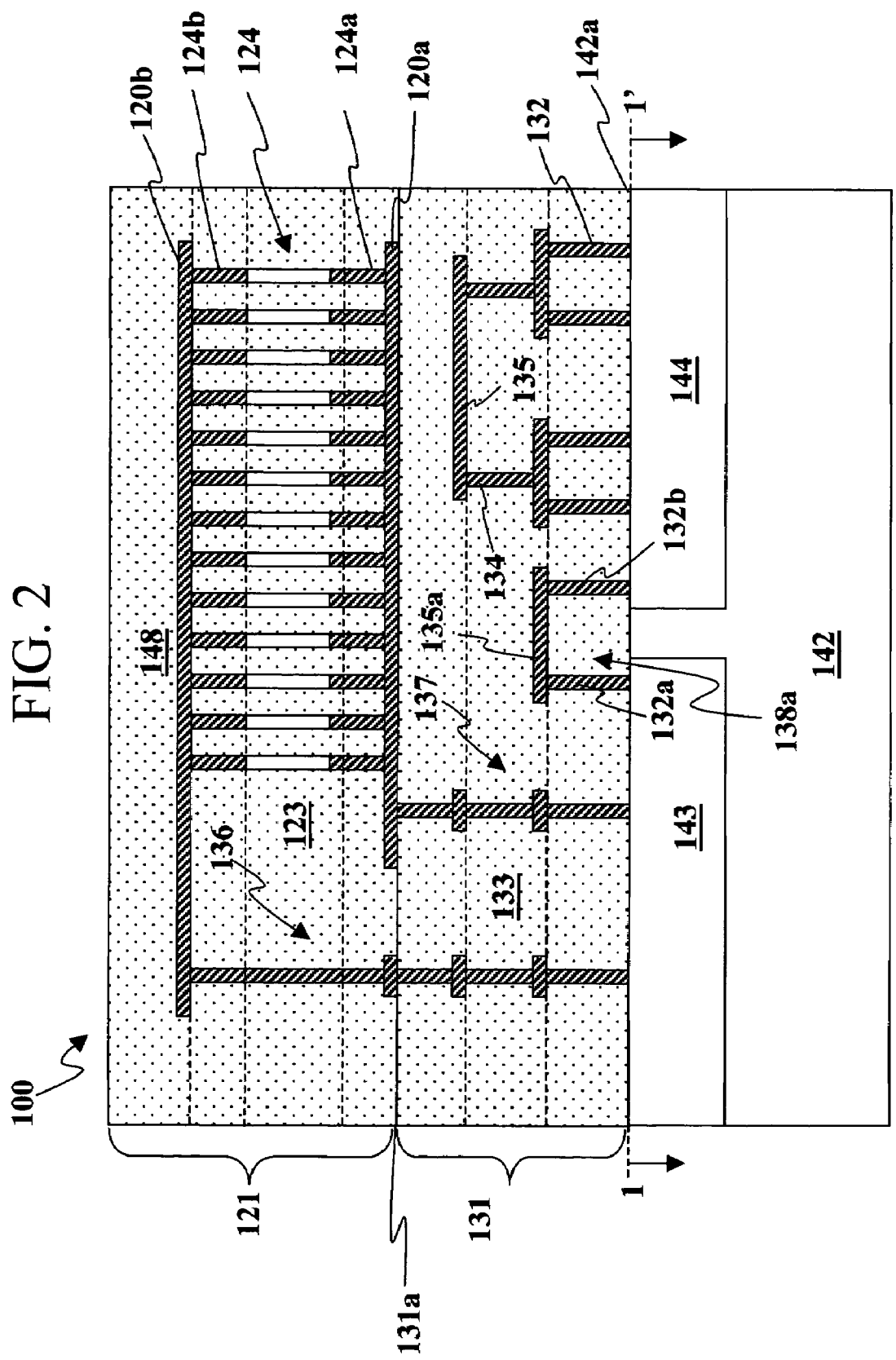
FIG. 2 is a simplified sectional view of the computer chip of FIG. 1 taken along a cut-line 2-2' of FIG. 1.

FIGS. 1 and 2 show simplified top and cross sectional views of a computer chip 100 which includes circuitry, in accordance with the present invention. FIG. 1 is a top view taken along a cut-line 1-1' of FIG. 2 and FIG. 2 is a sectional view taken along a cut-line 2-2' of FIG. 1. It should be noted that in the following figures, like reference characters indicate corresponding elements throughout the several views.

In this embodiment, computer chip 100 includes processor and control circuits which are carried by a substrate and coupled together so that signals can flow between them. Computer chip 100 also includes a memory circuit positioned above the processor and control circuits. The memory circuit is spaced apart from the processor and control circuits by an interconnect region. The memory circuit is also coupled to the control circuit through the interconnect region so that signals can flow therebetween. In this way, the control circuit can receive output signals from the processor circuit and, in response, provide signals to and receive signals from the memory circuit. In response, the control circuit provides input signals to the processor circuit. It should be noted that a memory circuit is discussed here and throughout the disclosure for illustrative purposes and that, in other embodiments, the memory circuit can be replaced with other circuitry which can be fabricated in the same or a similar manner.

A processor circuit typically executes a series of machine instructions to process data. It usually includes an ALU (Arithmetic/Logic Unit) to perform mathematical operations like addition, subtraction, multiplication and division. Modern processor circuits typically include floating point processors that can perform extremely sophisticated operations on large floating point numbers. A processor circuit provide commands to the control circuit to move data from one memory location to another in the memory circuit. A processor circuit can also make decisions and jump to a new set of instructions based on those decisions.

Figure 3A:
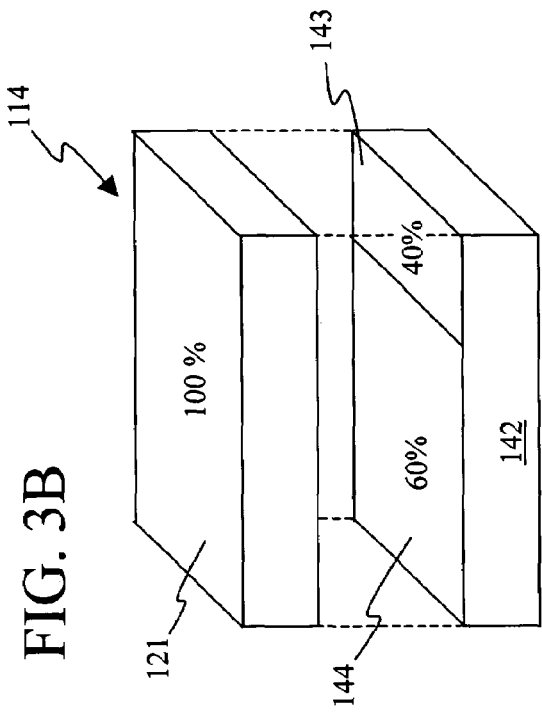
FIG. 3A is a perspective view of a computer chip with memory devices positioned on the same substrate as the processor and control circuits.

One advantage of computer chip 100 is that the memory circuit is positioned above the control and processor circuits which is desirable since the memory circuit typically occupies much more area than the control and processor circuits. In some examples of a typical computer chip where the processor, control, and memory circuits are positioned on the same substrate, the memory circuit can occupy 50% or more of the total area of the chip. An example of this is shown in FIG. 3A, which is a perspective view of a computer chip 110 with a memory circuit 221 positioned on the same substrate 111 as processor and control circuits 144 and 143. In this particular example, processor circuit 144 and control circuit 143 occupy 30% and 20%, respectively, of the total area of the chip, and memory circuit 221 occupies 50%. It should be noted, however, that they can occupy different amounts of area than that shown here.

Figure 3B:
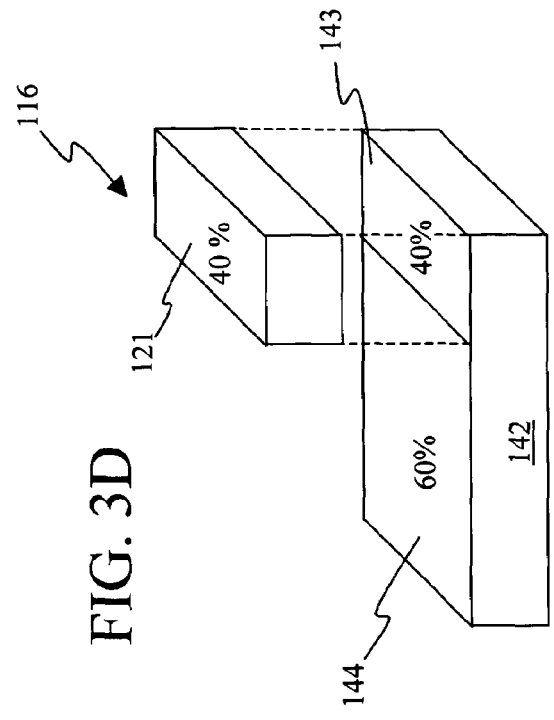
FIGS. 3B-3D are simplified perspective views of different computer chips in which the memory circuit is positioned above the processor and/or control circuits in accordance with the present invention.
Figure 3C:
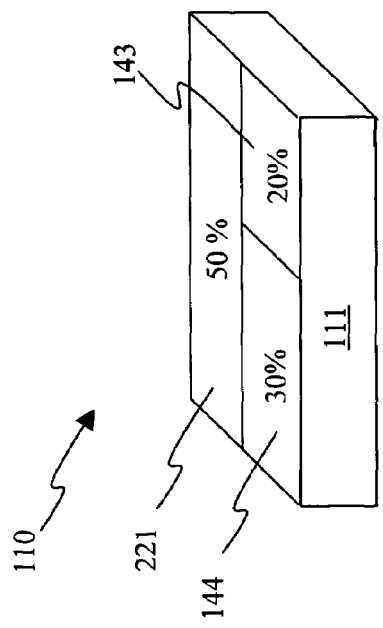
Figure 3D:
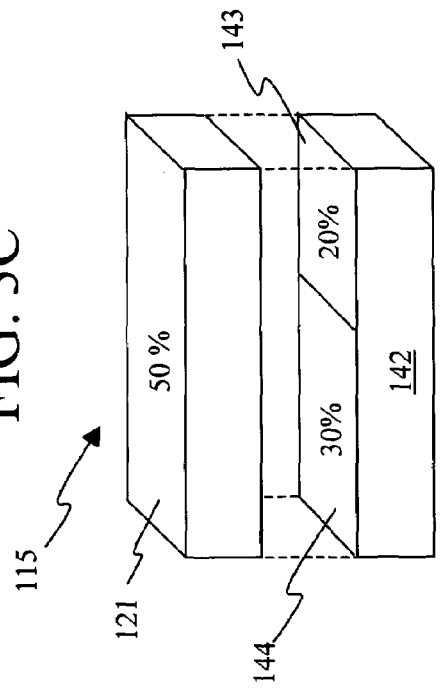

FIGS. 3B-3D are simplified perspective views of computer chips 114, 115, and 116, respectively, which are similar or identical to computer chip 100. In FIGS. 3B-3D, computer chips 114, 115, and 116 each include a substrate 142 which carries processor circuit 144 and control circuit 143. Chip 100 also includes memory circuit 121 positioned above and separated from substrate 142 by an interconnect region, which is not shown for simplicity. In the example shown in FIG. 3B, processor circuit 144 and control circuit 143 include more electronic devices and occupy twice the area than they do in computer chip 110 shown in FIG. 3A. This may be desirable so that computer chip 114 can operate with data represented by a higher number of bits. This may also be desired so that chip 114 can perform more complicated operations, such as more accurate computations or pipelining. Further, memory circuit 121 also occupies twice the area so that it can store more information, which speeds up the operation of computer chip 114.

In FIG. 3C, the area of computer chip 115 is half the size of computer chip 110 shown in FIG. 3A because processor 144 and control circuit 143 are the same size as that shown in FIG. 3A. Memory circuit 121 is positioned above substrate 142 and extends over the same area as processor circuit 144 and control circuit 143 combined. In this way, computer chip 115 in FIG. 3C occupies half the area as chip 110 and, consequently, is less expensive to fabricate because it has a higher yield and more chips can be fabricated on a single wafer.

In FIG. 3D, the area of computer chip 116 is the same as computer chip 110 shown in FIG. 3A, but processor 144 and control circuit 143 are the same size as that shown in FIG. 3B. Memory circuit 121 is positioned above substrate 142 and extends over the same area as control circuit 143, so its size is less than that shown in FIG. 3B. This may be useful in applications where a lot of memory is not needed. It should be noted that memory circuit 121 can also be positioned over processor circuit 142 or it can extend over both processor and control circuits 144 and 143.

It should also be noted that in some embodiments, the processor in the computer chip discussed herein can address memory devices on a separate chip positioned outside the computer chip. Further, in some embodiments, the computer chip can include embedded memory cells on the same surface as the control and processor circuits, in addition to the memory devices positioned above them. These memory devices can include a cache memory and/or ROM devices. For example the ROM devices can operate as a BIOS (Basic Input/Output System) for the computer system.

Another advantage of computer chip 100 is that the memory circuit is positioned closer to the control and processor circuits so that signals can flow therebetween in less time. This speed up operation of computer chip 100 because the access time is reduced and computer chip 100 is idle for fewer cycle times. Still another advantage of circuit 100 is that the control and processor circuits are fabricated with a different mask set than the memory circuit. Hence, the masks are less complicated and less expensive to make. A further advantage is that the memory devices are fabricated from blanket semiconductor layers after they have been bonded to the interconnect region. Hence, the memory devices do not need to be aligned with the processor and/or control circuitry, which is a complicated and expensive process.

In this embodiment, computer chip 100 includes control circuit 143 and processor circuit 144 carried by substrate 142 (FIG. 2). Computer chip 100 also includes memory circuit 121 spaced apart from processor circuit 144 and control circuit 143 by an interconnect region 131. In this way, memory circuit 121 is positioned above processor circuit 144 and control circuit 143 as discussed above. Memory circuit 121 is coupled to control circuit 143 through interconnect region 131 so that signals can flow therebetween.

In this embodiment, substrate 142 includes silicon, although it can include other materials which can support the subsequent structures positioned thereon. Other suitable substrate materials include gallium arsenide, indium phosphide, and silicon carbide, among others. It should be noted that substrate 142 can have portions doped n-type or p-type and some portions of substrate 142 can even be undoped. The preferred material for substrate 142 in this invention is single crystalline material which can have defects, but is generally better material quality compared to amorphous or polycrystalline material.

In this example, control circuit 143 and processor circuit 144 include digital circuitry known in the art. However, the digital circuitry is not shown in FIG. 1 or 2 for simplicity and ease of discussion. The digital circuitry can include electronic devices, such as transistors, which extend into substrate 142 and/or out of substrate 142 through a surface 142a (FIG. 2). Processor circuit 144 can operate in many different ways. For example, processor circuit 144 can operate as a central processing unit, such as those commonly found in a computer chip, a signal processor, such as those commonly found in communication systems, or a microcontroller. In other examples, processor circuit 144 can include analog circuitry, such as amplifiers and/or converters, for analog-to-digital converter applications. Control circuit 143 includes circuitry typically found in periphery logic circuits which read, write, and erase semiconductor memory devices. This circuitry typically includes a sense amplifier, column selector, and/or a row selector which are used to communicate with memory devices, as will be discussed in more detail below.

As shown in FIG. 2, interconnect region 131 is positioned on surface 142a of substrate 142. Interconnect region 131 and regions subsequently positioned thereon are not shown in FIG. 1 for simplicity. Here, interconnect region 131 includes an interlayer dielectric region (ILD) 133 with interconnects extending between surface 142a and a surface 131a of region 131 so that signals can flow therethrough. Each interconnect typically includes one or more interconnect lines 135 and/or one or more vias 134. Interconnect region 131 also typically includes one or more contacts 132 coupled to the electronic devices included in control circuit 143 or processor circuit 144.

In accordance with the invention, the interconnects included in interconnect region 131 can be formed so that signals, such as signal $S_a$, can flow between the various devices included in processor circuit 144. The interconnects can also be coupled together so that signals can flow between control circuit 143 and processor circuit 144. The interconnects, vias, and contacts can include conductive materials known in the art, such as aluminum (Al), copper (Cu), tungsten (W), titanium (Ti), or a doped semiconductor, among others.

For example, signal $S_a$ can flow between processor circuit 144 and control circuit 143 through an interconnect 138a included in interconnect region 131, as shown in FIG. 2. Interconnect 138a includes contacts 132a and 132b and an interconnect line 135a. Ends of contacts 132a and 132b are coupled to processor circuit 144 and control circuit 143, respectively, and extend upwardly therefrom surface 142a. Interconnect line 135a extends between opposed ends of contacts 132a and 132b. Here, control circuit 143 is positioned near processor circuit 144 so that the distance traveled by signals $S_a$ flowing therebetween is reduced.

In this embodiment, a memory circuit 121 is positioned on interconnect region 131 and bonded to surface 131a. The bonding can be done in many different ways. For example, the bonding can be done by heating bonding surface 131a and coupling memory circuit 121 thereto. Since memory circuit 121 is bonded to interconnect region 131 instead of deposited thereon, it can include better quality semiconductor material. One reason the material is better quality is because it is more crystalline. It is more crystalline than polycrystalline material which is typically deposited on dielectric regions when wafer bonding is not used. More information about wafer bonding can be found in co-pending U.S. patent applications titled "SEMICONDUCTOR LAYER STRUCTURE AND METHOD OF MAKING THE SAME," "SEMICONDUCTOR BONDING AND LAYER TRANSFER METHOD," and "WAFER BONDING METHOD" filed on an even date herewith by the same inventor and incorporated herein by reference.

Memory circuit 121 includes a bit line 120a positioned on surface 131a. A dielectric region 123 is positioned on surface 131a and bit line 120a. Bit line vias 124a extend upwardly therefrom bit line 120a and through dielectric region 123. The number of bit line vias 124a depends on the number of devices it is desired to form in memory circuit 121. Each bit line via 124a is coupled to an electronic device 124.

Electronic device 124 is typically a transistor or a memory device, although it can include other devices. The transistor can be a metal oxide semiconductor field effect transistor (MOSFET) and the memory device can be a negative differential resistance (NDR) static random access memory (SRAM) cell. An NDR SRAM includes a layer structure that operates as a transistor and a layer structure that operates as a thyristor. The transistor and thyristor are coupled together to operate as the NDR SRAM cell. More information regarding the NDR SRAM cell can be found in co-pending U.S. patent application titled "SEMICONDUCTOR MEMORY DEVICE" filed on the same date herewith by the same inventor and incorporated herein by reference.

A reference line via 124b is coupled to the opposite end of each device 124. Each reference line via 124b extends upwardly from its corresponding device 124 where it connects to a reference line 120b. In this way, each device 124 is coupled between bit line and reference lines vias 124a and 124b. It should be noted, however, that in other embodiments, line 120a can be used as a reference line and line 120b can be used as a bit line. A dielectric region 148 is positioned on dielectric region 123 and reference line 120b.

Memory circuit 121 and interconnect region 131 include interconnects so that signals can flow between control circuit 143 and bit line 120a and reference line 120b. In this particular example, a reference interconnect 136 extends through regions 133 and 123 so that one end is coupled to control circuit 143 and the opposite end is coupled to reference line 120b. Similarly, a bit interconnect 137 extends through region 133 so that one end is coupled to control circuit 143 and the other end is coupled to bit line 120a. Hence, control circuit 143 can provide a bit signal to bit line 120a through interconnect 137 and a reference signal to reference line 120b through interconnect 136. In this way, control circuit 143 can communicate with the devices included in device structure 124. In other examples, the reference line 120b can be connected to an outside contact (not shown) which provides a reference voltage or current from outside of the circuit 100.

In operation, various signals, such as signal $S_a$, can flow between processor circuit 144 and control circuit 143. In response, control circuit 143 provides signals to and receives signals from memory circuit 121 through interconnects 136 and 137. The signals can be to read, write, and/or erase information in memory circuit 121. Control circuit 143 then provides input signals to processor circuit 144. The input signals can be data values stored by memory circuit 121 that processor circuit 144 desires to process.

Figure 4:
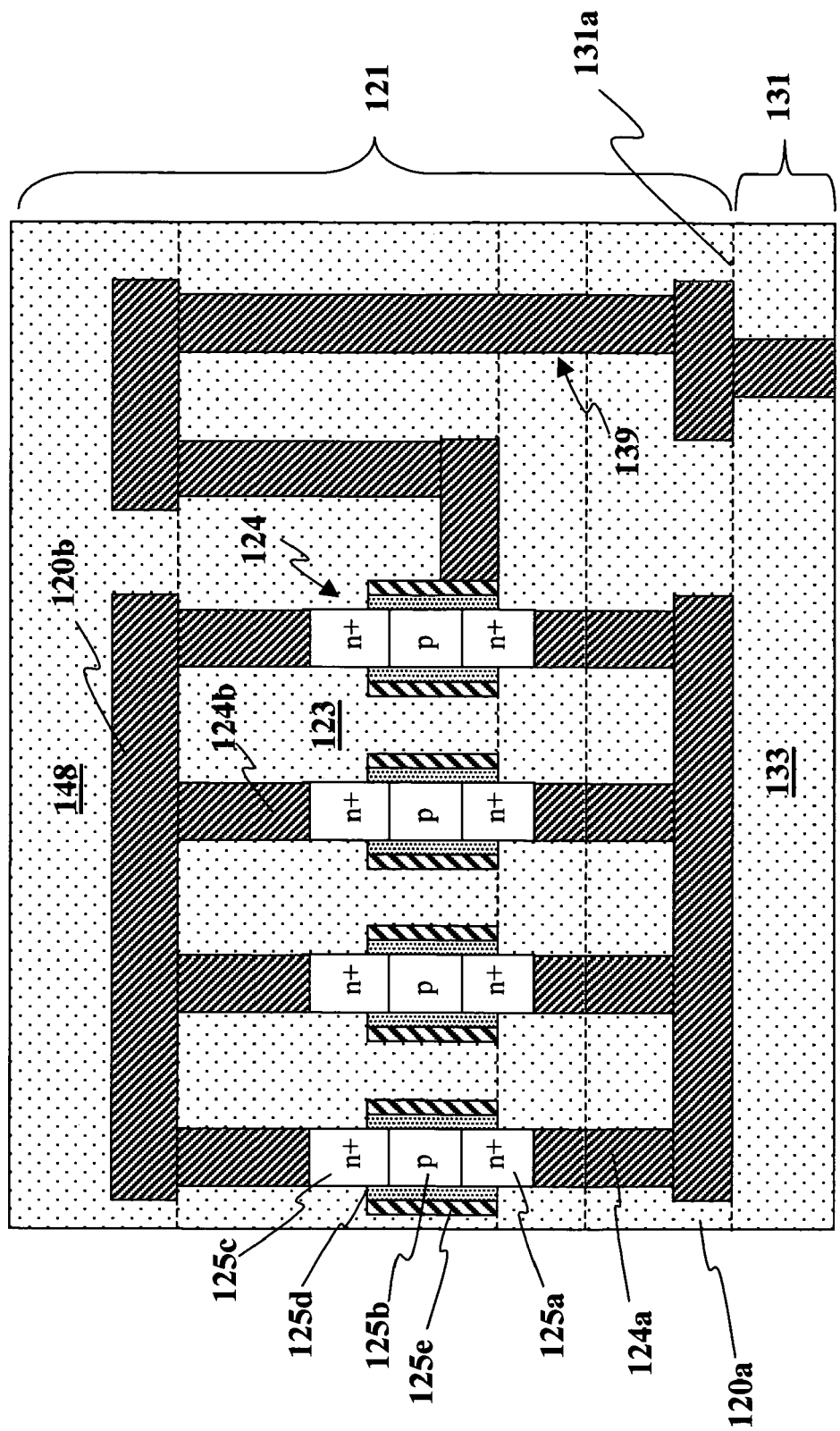
FIG. 4 is a more detailed view of a memory circuit shown in FIGS. 2 and 6.

FIG. 4 shows a more detailed sectional view of memory circuit 121. In this particular example, each electronic device 124 is a single transistor capacitorless dynamic random access memory (DRAM) device, although devices 124 can include other devices, such as a SONOS (Semiconductor Oxide Nitride Oxide Semiconductor) type nonvolatile memory device with a ONO (Oxide Nitride Oxide) dielectric. Here, device 124 includes an $n^+pn^+$ stack of layers, although it can include other layer structures, such as a npn stack, a $p^+np^+$ stack, or a pnp stack. The $n^+pn^+$ stack includes an $n^+$-type doped region 125a positioned on bit line via 124a and a p-type doped region 125b positioned on region 125b. An $n^+$-type doped region 125c is positioned on region 125c so that it is coupled between region 125b and reference line via 124b. An insulating region 125d is positioned around the outer periphery of the stack of regions 125a, 125b, and 125c. A control terminal 125e is positioned around the outer periphery of insulating region 125d.

In this way, the conductivity of regions 125a, 125b, and/or 125c can be adjusted in response to a word signal provided to control terminal 125e. The word signal is provided by control circuit 143 through a word interconnect 139. Word interconnect 139 is coupled between control circuit 143 and control terminal 125e and extends through dielectric regions 123 and 133 similar to interconnects 136 and 137. Interconnect 139, insulator region 125d, and control terminal 125e are not shown in FIG. 2 for simplicity.

Figure 5:
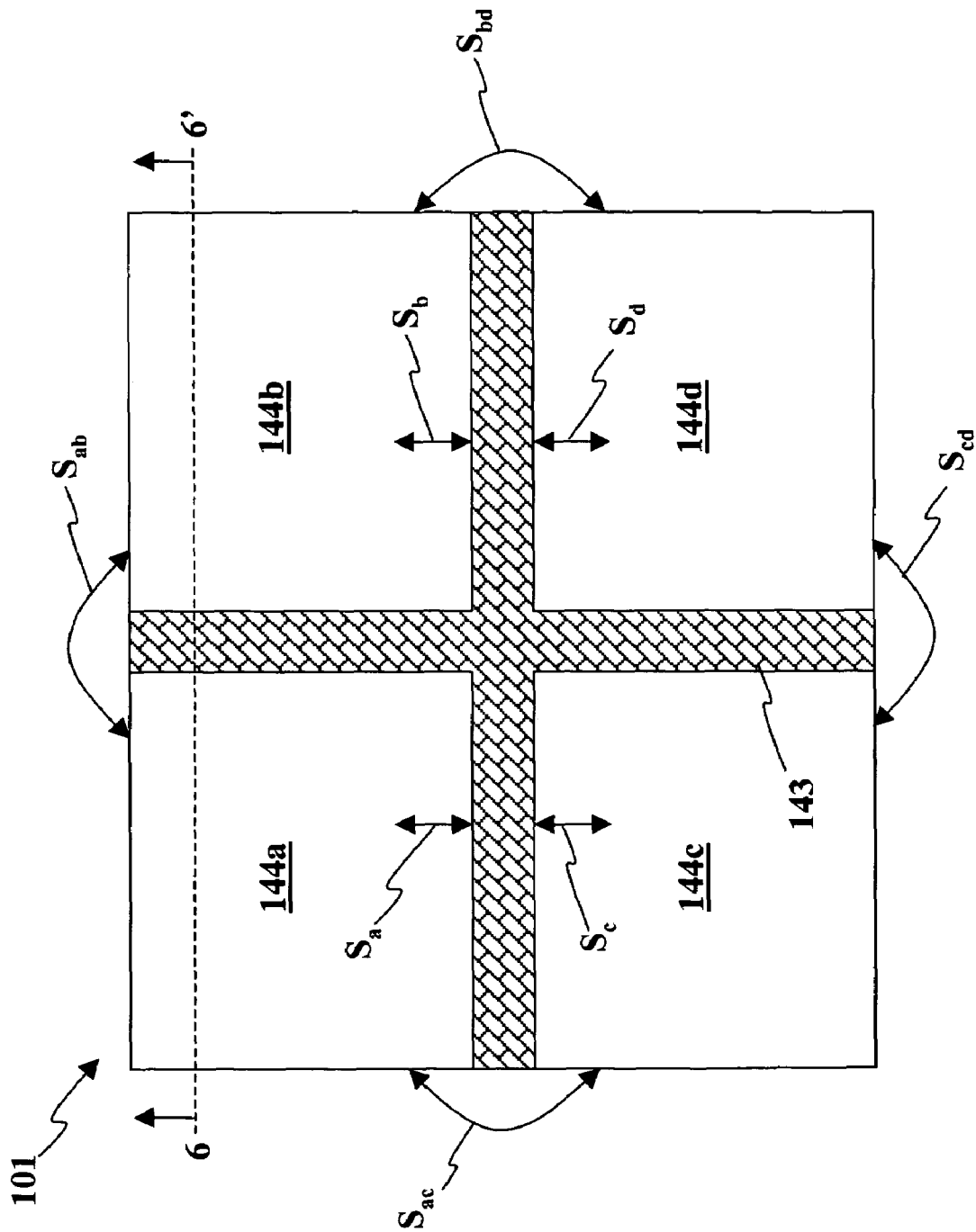
FIG. 5 is a simplified top view of a computer chip, in accordance with the present invention, with multiple processors separated by a control circuit, the sectional view being taken along a cut line 5-5' of FIG. 6.
Figure 6:
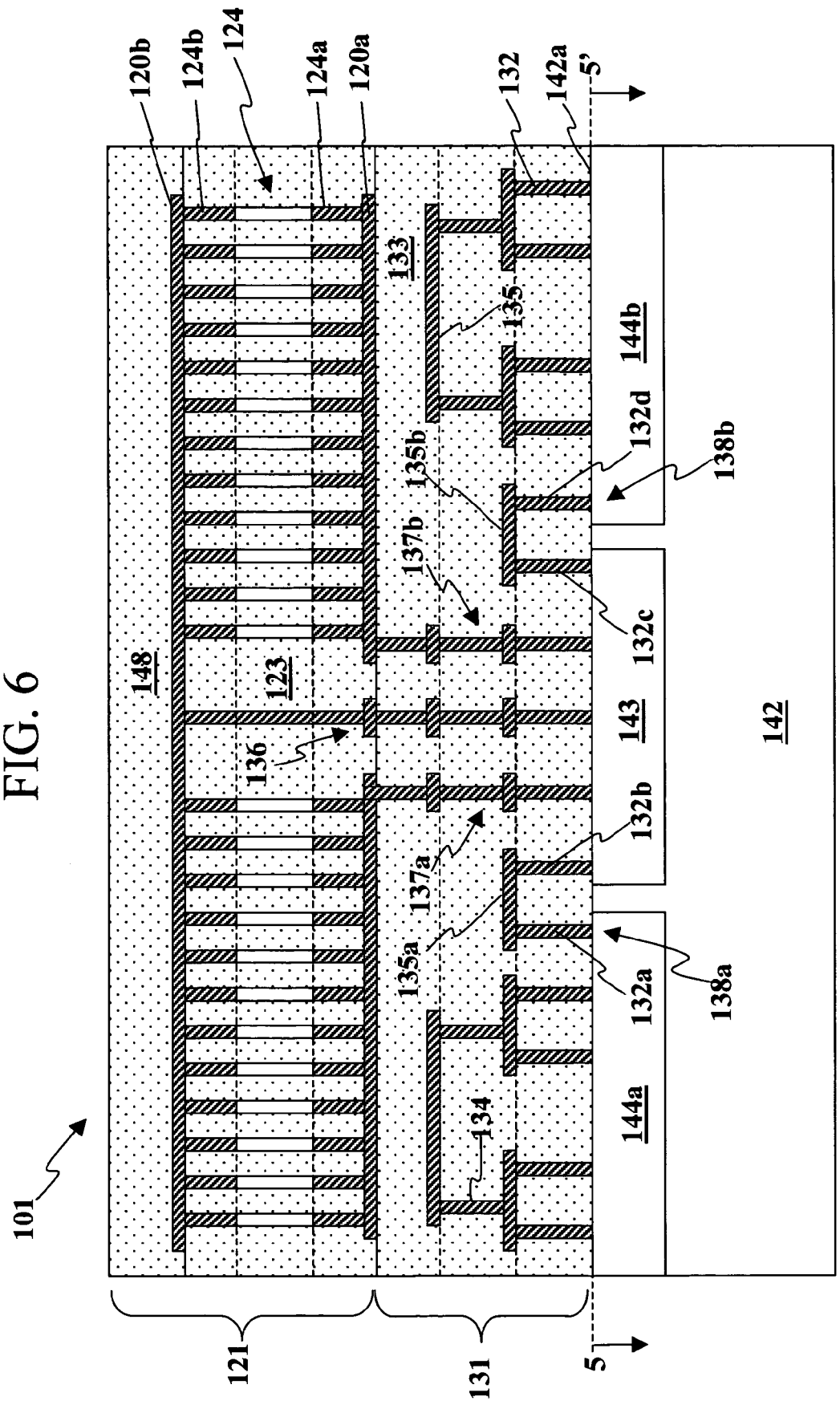
FIG. 6 is a simplified sectional view of the computer chip of FIG. 5 taken along a cut-line 6-6' of FIG. 5.

FIGS. 5 and 6 show simplified top and sectional views of a computer chip 101 in accordance with the present invention. FIG. 5 is a top view taken along a cut-line 5-5' of FIG. 6 and FIG. 6 is a sectional view taken along a cut-line 6-6' of FIG. 5. In this embodiment, chip 101 includes multiple processors which can communicate with the control circuit and the memory circuit as discussed above in conjunction with FIGS. 1-2, 3B-3D, and 4. In this embodiment, however, the processors can also communicate with each other using an interface circuit (not shown) which provides better data flow between processors. The data flow is better because it can happen faster and with less noise so there are fewer errors in the signal.

Computer chip 102 includes control circuit 143 and processors 144a-144d which are carried by substrate 142 (FIG. 6). Here, control circuit 143 is positioned in a region that is cross-shaped from a top view (FIG. 5) so that it extends between processors 144a-144d. In this way, the processors are separated from each other by control circuit 143. It should be noted that in this example, processors 144a-144d can be the same or similar to processor circuit 144 discussed above in conjunction with FIGS. 1-2, 3B-3D, and 4. Interconnect region 131 is positioned on surface 142a of substrate 142 so that it covers control circuit 143 as well as processors 144a-144d. However, in other embodiments, interconnect region 131 can be positioned so that it covers only a portion of logic circuit 143, processor circuit 144a, processor circuit 144b, processor circuit 144c, and/or processor circuit 144d.

In chip 101, various signals can flow between processors 144a-144d and control circuit 143. For example, signal $S_a$, $S_b$, $S_c$, and $S_d$ can flow between processor circuit 144a, 144b, 144c, and 144d, respectively, and control circuit 143, as shown in FIG. 5. Signals can also flow between processors 144a-144d without flowing through control circuit 143. For example, signals $S_{ab}$, $S_{ac}$, $S_{bd}$, and $S_{cd}$ can flow between processors 144a-144b, 144a-144c, 144b-144d, and 144c-144d, respectively, as shown in FIG. 5. Signals $S_{ab}$, $S_{ac}$, $S_{bd}$, and $S_{cd}$ can flow through interconnects which extend through interconnect region 131. The interconnects can be similar to interconnect 138, but are not shown for simplicity.

In a particular example, signal $S_a$ can flow between processor circuit 144a and control circuit 143 through an interconnect 138a, as shown in FIG. 6. Interconnect 138a includes contacts 132a and 132b and interconnect line 135a, as described above in conjunction with FIG. 2. Similarly, signal $S_b$ can flow between processor circuit 144b and control circuit 143 through an interconnect 138b. Interconnect 138b includes contacts 132c and 132d and interconnect line 135b. Ends of contacts 132c and 132d are coupled to processor circuit 144b and control circuit 143, respectively, and extend upwardly therefrom. Interconnect line 135b extends between opposed ends of contacts 132c and 132d so that signal $S_b$ can flow between processor circuit 144b and control circuit 143. Signals $S_c$ and $S_d$ can flow between control circuit 143 and corresponding processors 144c and 144d with similar interconnects included in interconnect region 131.

One advantage of chip 101 is that the distance between control circuit 143 and processors 144a-144d is reduced so that they can communicate with each other faster. This increases the speed of computer chip 100. Another advantage is that the design of chip 101 is convenient because each processor circuit 144a-144d can have the same or a similar design which simplifies its fabrication.

Figure 7:
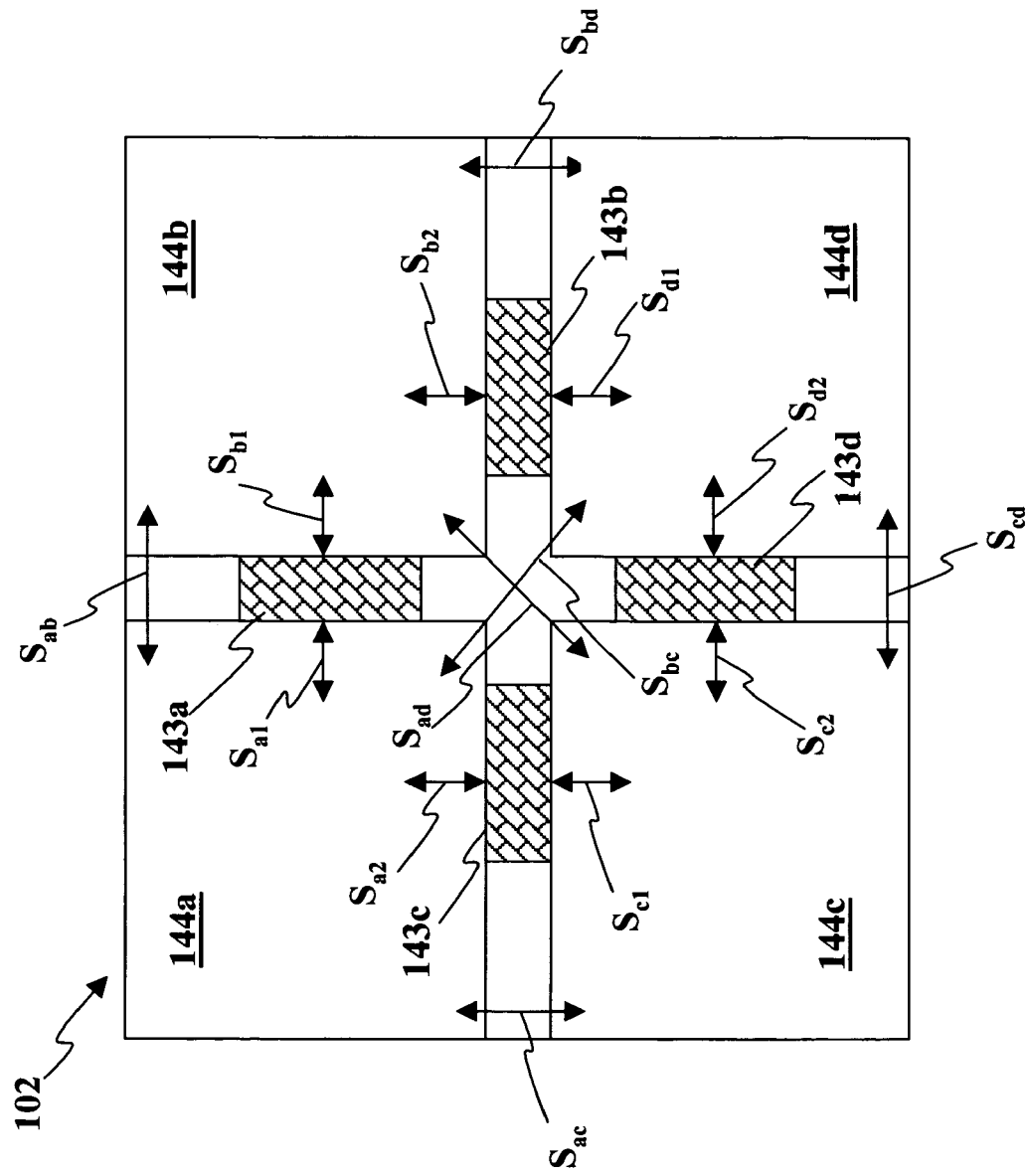
FIG. 7 is a simplified top view of another embodiment of a computer chip, in accordance with the invention, with multiple processor circuits and multiple control circuits.

FIG. 7 is a top view of a computer chip 102 in accordance with the present invention. Chip 102 includes processors 144a-144d positioned near each other in a manner similar to that of chip 101 shown in FIG. 5. Here, however, the control circuit includes separate control circuits 143a-143d. In this example, processors 144a and 144b are spaced apart by control circuit 143a, processors 144b and 144d are spaced apart by control circuit 143b, processors 144a and 144c are spaced apart by control circuit 143c, and processors 144c and 144d are spaced apart by control circuit 143d. It should be noted that each control circuit 143a-143d can be the same or similar to control circuit 143 shown in FIG. 4.

Here, signals $S_{a1}$ and $S_{b1}$ flow between control circuit 143a and processors 144a and 144b, respectively. Signals $S_{a2}$ and $S_{c1}$ flow between control circuit 143c and processors 144a and 144c, respectively. Signals $S_{b2}$ and $S_{d1}$ flow between control circuit 143b and processors 144b and 144d, respectively. Signals $S_{c2}$ and $S_{d2}$ flow between control circuit 143d and processors 144c and 144d, respectively.

Signals $S_{a1}$, $S_{b1}$, $S_{a2}$, $S_{c1}$, $S_{b2}$, $S_{d1}$, $S_{c2}$, and $S_{d2}$ flow between corresponding control circuits and processors through interconnects, similar to interconnects 138a and 138b, as described above, in conjunction with FIG. 6. Signals $S_{ab}$, $S_{ac}$, $S_{bd}$, $S_{ad}$, $S_{bc}$, and $S_{cd}$ flow between corresponding processors 144a-144d through conductive lines which extend through substrate 142 or on its surface 142a. However, these conductive lines are not shown for simplicity. One advantage of chip 102 is that signals $S_{ab}$, $S_{ac}$, $S_{bd}$, $S_{cd}$, $S_{ad}$, and $S_{bc}$, can flow therebetween processors 144a-144d faster so that chip 102 can operate faster. One reason the signals can flow faster is because the interconnects are shorter so the distance of travel is shorter and their capacitance is smaller.

Figure 8:
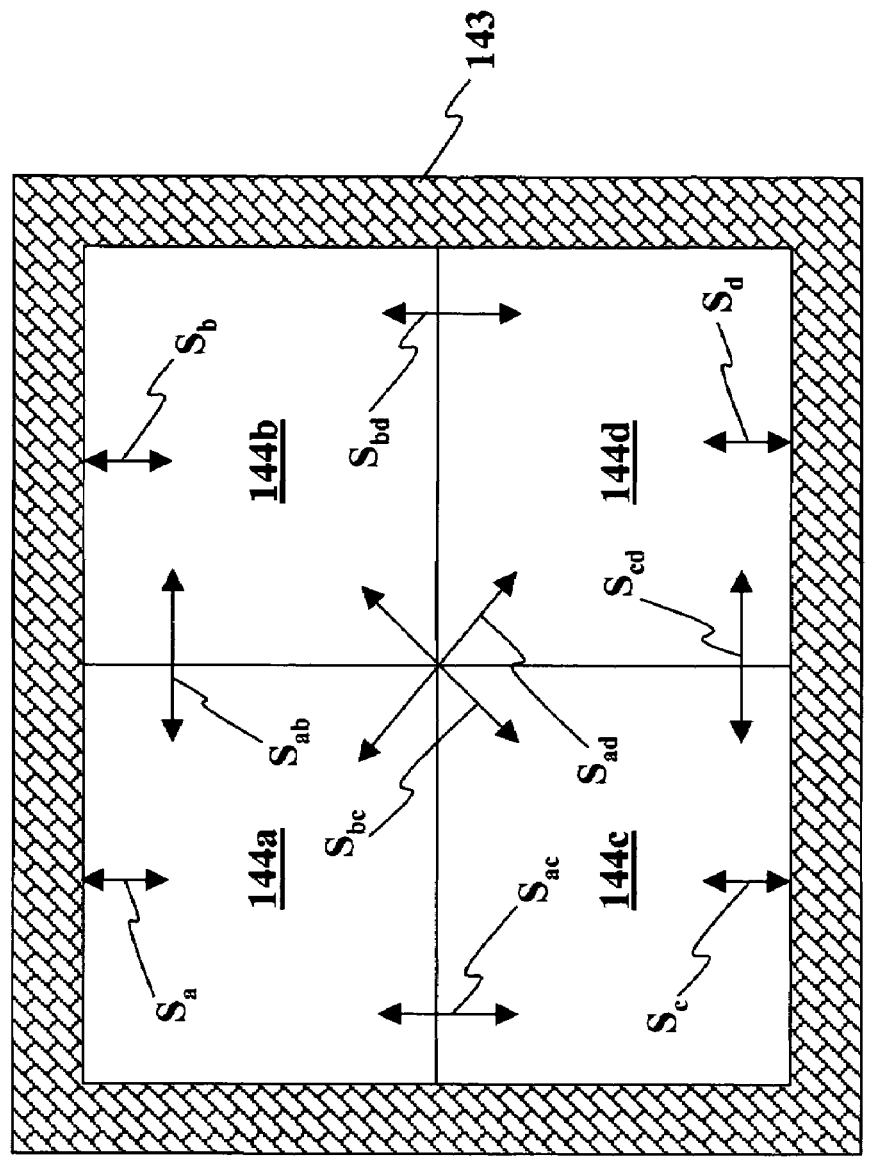
FIG. 8 is a simplified top view of another embodiment of a computer chip, in accordance with the present invention, with multiple processor circuits surrounded by a control circuit.

FIG. 8 is a top view of a computer chip 103 in accordance with the present invention. Chip 103 includes processors 144a-144d positioned adjacent to each other. However, in this example, control circuit 143 extends around an outer periphery of processors 144a-144d. In this way, processors 144a-144d are surrounded by control circuit 143. Signals $S_a$, $S_b$, $S_c$, and $S_d$ can flow between control circuit 143 and corresponding processors 144a-144d through interconnects, similar to interconnects 138a and 138b, as described above, in conjunction with FIG. 6. Similarly, processors 144a-144d are coupled together so that signals $S_{ab}$, $S_{ac}$, $S_{bd}$, $S_{ad}$, $S_{bc}$, and $S_{cd}$ can flow therebetween as described above in conjunction with FIG. 7 above.

Figure 9:
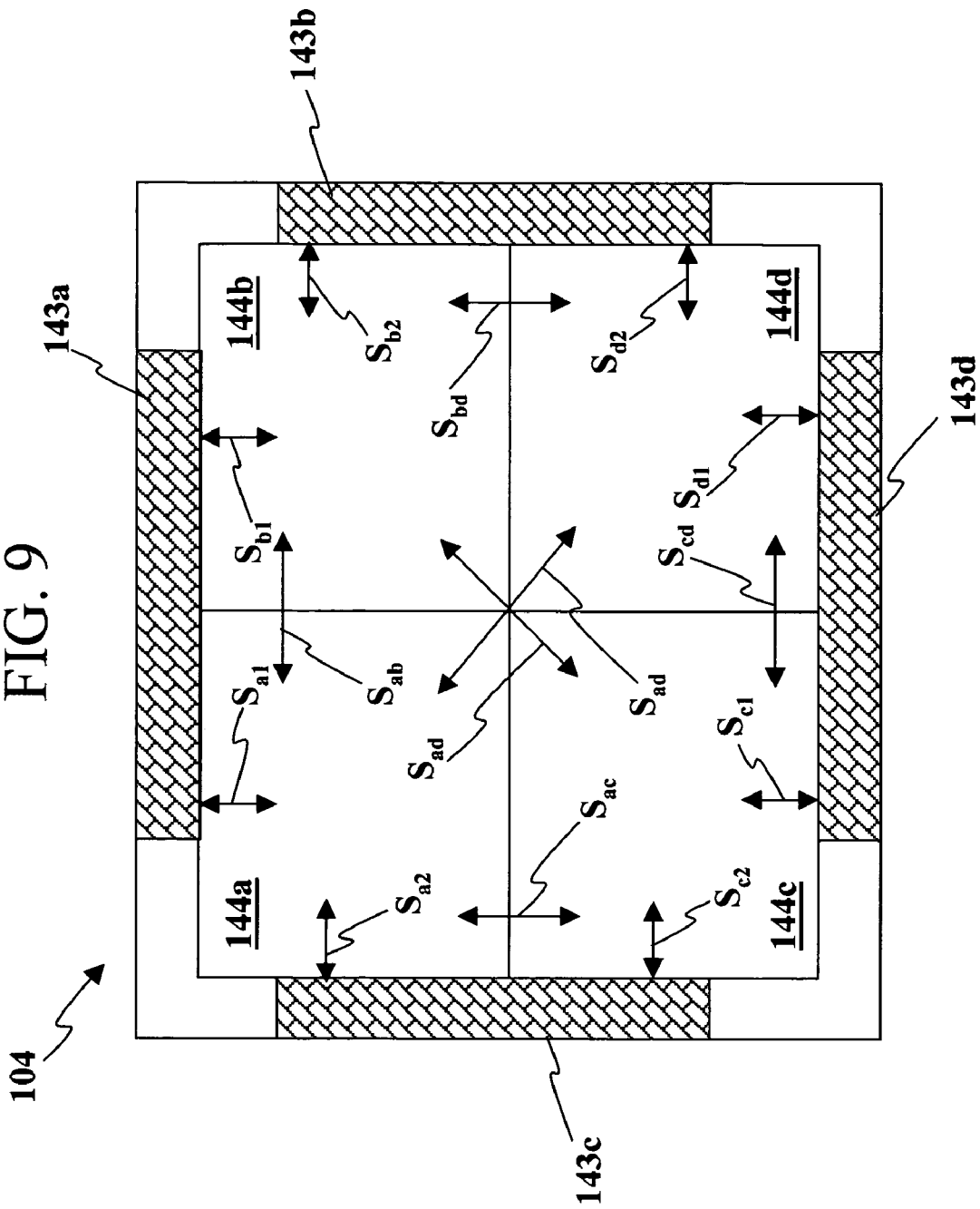
FIG. 9 is a simplified top view of another embodiment of a computer chip, in accordance with the present invention, with multiple processors partially surrounded by multiple control circuits.

FIG. 9 is a top view of a computer chip 104 in accordance with the present invention. Chip 104 includes processors 144a-144d positioned near each other in a manner similar to that of chip 103 shown in FIG. 8. Here, however, control circuit 143a extends along an outer periphery of processors 144a and 144b. Similarly, control circuit 143b extends along an outer periphery of processors 144b and 144d. Control circuit 143c extends along an outer periphery of processors 144a and 144c and control circuit 143d extends along an outer periphery of processors 144c and 144d.

Signals $S_{a1}$, $S_{a2}$, $S_{b1}$, $S_{b2}$, $S_{c1}$, $S_{c2}$, $S_{d1}$, and $S_{d2}$ can flow between corresponding control circuits 143a-143d and corresponding processors 144a-144d through interconnects, similar to interconnects 138a and 138b, as described above, in conjunction with FIG. 6. Similarly, processors 144a-144d are coupled together so that signals $S_{ab}$, $S_{ac}$, $S_{bd}$, $S_{ad}$, $S_{bc}$, and $S_{cd}$ can flow therebetween as described above in conjunction with FIG. 6 above.

The present invention is described above with reference to preferred embodiments. However, those skilled in the art will recognize that changes and modifications may be made in the described embodiments without departing from the nature and scope of the present invention. Various further changes and modifications will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

1. Circuitry comprising:
   a substrate;
   control circuitry carried by the substrate;
   processor circuitry carried by the substrate and positioned near the control circuitry;

an interconnect region positioned on surfaces of the control and processor circuitry to provide communication therebetween; and memory circuitry positioned on the interconnect region, the memory circuitry being formed from a stack of crystalline semiconductor materials, the interconnect region providing communication between the memory circuitry and the control circuitry.

2. The circuit of claim 1 wherein the memory circuitry includes a thyristor.

3. The circuit of claim 1 wherein the memory circuitry includes at least one negative differential resistance static random access memory device.

4. The circuitry of claim 1 wherein the memory circuitry includes reference, word, and bit lines which allow the control circuitry to communicate with the memory circuitry.

5. The circuitry of claim 4 wherein the memory circuitry includes at least one memory device which includes a stack of doped semiconductor layers, the stack of doped semiconductor layers extending between the reference and bit lines.

6. The circuitry of claim 1 wherein current flow through the stack of semiconductor layers is in a direction at a non-zero angle relative to the surface of the substrate.

7. The circuitry of claim 1, wherein current flow through the stack of semiconductor layers is in a direction substantially perpendicular to the surface of the substrate.

8. Circuitry comprising:
a substrate;
control and processor circuitry carried by the substrate;
an interconnect region which provides communication between the control and processor circuitry; and
memory circuitry spaced from the control and processor circuitry by the interconnect region, the memory circuitry being formed from a stack of crystalline semiconductor materials, the interconnect region providing communication between the memory circuitry and the control circuitry;
wherein current flow through the stack of semiconductor layers is in a direction at a non-zero angle relative to the surface of the substrate.

9. The circuitry of claim 8 wherein the memory circuitry includes at least one thyristor.

10. The circuitry of claim 8 wherein the memory circuitry includes a negative differential resistance static random access memory device.

11. The circuitry of claim 8 wherein the memory circuitry includes reference, word, and bit lines which allow the control circuitry to communicate with the memory circuitry.

12. The circuitry of claim 11 wherein the memory circuitry includes a vertically oriented memory device, the vertically oriented memory device extending between the reference and bit lines.

13. Circuitry comprising:
a substrate;
control and processor circuitry carried by the substrate;
an interconnect region which covers the control and processor circuitry and provides communication therebetween; and
memory circuitry positioned on the interconnect region, the memory circuitry including a vertically oriented semiconductor device, the interconnect region providing communication between the vertically oriented semiconductor device and the control circuitry.

14. The circuitry of claim 13 wherein the vertically oriented semiconductor device operates as a thyristor.

15. The circuitry of claim 13 wherein the vertically oriented semiconductor device operates as a negative differential resistance static random access memory device.

16. The circuitry of claim 13 wherein the memory circuitry includes reference, word, and bit lines which allow the control circuitry to communicate with the vertically oriented semiconductor device.

17. The circuitry of claim 13, wherein current flow through the vertically oriented semiconductor device is in a direction at a non-zero angle relative to the surface of the substrate.

18. The circuitry of claim 13, further including reference and bit lines connected to opposed ends of at least one of the vertically oriented semiconductor device.

19. The circuitry of claim 18, wherein current flow through the vertically oriented semiconductor device between the reference and bit lines is in a direction perpendicular to the surface of the substrate.

20. The circuitry of claim 13, further including a word line connected to a sidewall of the at least one of the vertically oriented semiconductor device.

21. The circuitry of claim 1, wherein the stack of crystalline semiconductor materials is bonded to the interconnect region.

22. The circuitry of claim 21, wherein the memory circuitry is formed after the stack of crystalline semiconductor materials is bonded to the interconnect region.

23. The circuitry of claim 1, further including a bonding interface between the memory circuitry and interconnect region.

24. The circuitry of claim 23, wherein the memory circuitry and control circuitry are in communication with each other through the bonding interface.

25. The circuitry of claim 7, further including a bonding interface between the memory circuitry and interconnect region wherein the current flows through the bonding interface.

26. The circuitry of claim 8, wherein the stack of crystalline semiconductor layers and interconnect region are coupled together with bonding.

27. The circuitry of claim 26, wherein the memory circuitry is formed after the stack of crystalline semiconductor layers and interconnect region are coupled together with bonding.

28. The circuitry of claim 8, wherein the current that flows through the stack of crystalline semiconductor layers flows though a bonding interface between the stack of crystalline semiconductor layers and interconnect region.

29. The circuitry of claim 8, wherein the memory circuitry and control circuitry are in communication with each other through a bonding interface.

30. The circuitry of claim 13, wherein the vertically oriented semiconductor device includes a stack of crystalline semiconductor materials.

31. The circuitry of claim 30, wherein the stack of crystalline semiconductor materials and interconnect region are coupled together with bonding.

32. The circuitry of claim 31, wherein the vertically oriented semiconductor device is formed after the stack of crystalline semiconductor materials and interconnect region are coupled together with bonding.

33. The circuitry of claim 31, wherein the stack of crystalline semiconductor materials and interconnect region are coupled together with bonding before the memory circuitry is formed.

34. The circuitry of claim 13, further including a bonding interface positioned between the vertically oriented semiconductor device and control circuitry.

35. The circuitry of claim 13, further including a bonding interface through which the vertically oriented semiconductor device and control circuitry are in communication with each other.

36. Circuitry, comprising:
control and processor circuitry carried by a substrate; an interconnect region; and memory circuitry carried by the interconnect region, wherein the memory circuitry includes a stack of semiconductor materials, wherein the stack of semiconductor materials includes crystalline semiconductor material; wherein the interconnect region extends between the memory circuitry and substrate so the memory circuitry is spaced from the substrate by interconnect region.

37. The circuitry of claim 36, wherein the memory circuitry operates in response to a current flow through the bonding interface.

38. The circuitry of claim 37, wherein the current flow through the bonding interface is provided by the control circuit.

39. The circuitry of claim 37, wherein the current flow through the bonding interface is provided by the control circuit through the interconnect region.

40. The circuitry of claim 36, further including a bonding interface, wherein the stack of semiconductor materials and interconnect region are connected to each other through the bonding interface.

41. The circuitry of claim 36, further including a bonding interface, wherein the stack of semiconductor materials and control circuitry are connected to each other through the bonding interface and interconnect region.

42. The circuitry of claim 36, wherein the stack of semiconductor materials is coupled to the interconnect region through a bonding interface.

43. The circuitry of claim 36, wherein the stack of semiconductor materials includes two regions of semiconductor material which are adjacent to each other.

44. The circuitry of claim 36, wherein the stack of semiconductor materials includes an n-type doped region, and two p-type doped regions.

45. The circuitry of claim 36, wherein the stack of semiconductor materials includes a p-type doped region, and two n-type doped regions.

46. The circuitry of claim 36, wherein the stack of semiconductor materials includes a pn junction.

47. The circuitry of claim 36, wherein the stack of semiconductor materials includes two pn junctions.

48. The circuitry of claim 36, further including a vertically oriented semiconductor device which includes the stack of semiconductor materials.

49. The circuitry of claim 36, further including a vertically oriented semiconductor thyristor device which includes the stack of semiconductor materials.

50. The circuitry of claim 49, further including a bonding interface, wherein the vertically oriented semiconductor thyristor device operates in response to a current flow through the bonding interface.

51. The circuitry of claim 36, further including a negative differential resistance static random access memory device which includes the stack of semiconductor materials.

52. The circuitry of claim 51, further including a bonding interface, wherein the negative differential resistance static random access memory device operates in response to a current flow through the bonding interface.

53. The circuitry of claim 36, wherein the memory circuitry includes a vertically oriented semiconductor device, and the control circuitry includes horizontally oriented semiconductor devices.

54. The circuitry of claim 36, further including processor circuitry in communication with the control circuitry through the interconnect region.

55. The circuitry of claim 54, wherein the memory circuitry includes a vertically oriented semiconductor device, and the control and processor circuitry include horizontally oriented semiconductor devices.

* * * * *

UNITED STATES PATENT AND TRADEMARK OFFICE
CERTIFICATE OF CORRECTION

PATENT NO. : 7,633,162 B2 Page 1 of 1
APPLICATION NO. : 11/092521
DATED : December 15, 2009
INVENTOR(S) : Sang-Yun Lee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 785 days.

Signed and Sealed this

Twenty-first Day of December, 2010

David J. Kappos
*Director of the United States Patent and Trademark Office*